US010879157B2

(12) United States Patent
Gandhi

(10) Patent No.: US 10,879,157 B2
(45) Date of Patent: Dec. 29, 2020

(54) HIGH DENSITY SUBSTRATE AND STACKED SILICON PACKAGE ASSEMBLY HAVING THE SAME

(71) Applicant: Xilinx, Inc., San Jose, CA (US)

(72) Inventor: Jaspreet Singh Gandhi, San Jose, CA (US)

(73) Assignee: XILINX, INC., San Jose, CA (US)

( * ) Notice: Subject to any disclaimer, the term of this patent is extended or adjusted under 35 U.S.C. 154(b) by 8 days.

(21) Appl. No.: 16/194,213

(22) Filed: Nov. 16, 2018

(65) Prior Publication Data

US 2020/0161229 A1 May 21, 2020

(51) Int. Cl.

*H01L 23/498* (2006.01)
*H01L 23/00* (2006.01)
*H01L 21/768* (2006.01)
*H01L 21/48* (2006.01)

(Continued)

(52) U.S. Cl.

CPC ...... *H01L 23/49811* (2013.01); *H01L 21/486* (2013.01); *H01L 21/4864* (2013.01); *H01L 21/76802* (2013.01); *H01L 23/49827* (2013.01); *H01L 23/49838* (2013.01); *H01L 24/12* (2013.01); *B23K 2101/40* (2018.08); *H01L 2021/60135* (2013.01); *H01L 2224/81815* (2013.01); *H01L 2924/14* (2013.01)

(58) Field of Classification Search

CPC ..... H01L 2224/2201; H01L 2224/2205; H01L 2224/221; H01L 2224/224; H01L 2224/22505; H01L 23/49811; H01L 23/49827; H01L 23/49838; H01L 24/12; H01L 21/76802; H01L 21/4864; H01L 21/486; H01L 2021/60135; H01L 2224/81815; H01L 2924/14; B23K 2101/40

See application file for complete search history.

(56) References Cited

U.S. PATENT DOCUMENTS

2015/0357276 A1* 12/2015 Shimizu ............... H05K 3/0023 361/783
2017/0301560 A1* 10/2017 Yoon ................... H01L 21/4853
2017/0372991 A1* 12/2017 Tsukamoto ....... H01L 23/49822

OTHER PUBLICATIONS

Wantanabe, Shoji, "Development of Organic Multi Chip Package for High Performance Application", Shinko Electric Industries Co., Ltd, i-NEMI Substrate & Packaging Technology Workshop, 24 pages, Apr. 22, 2014, Toyama, Japan.

* cited by examiner

*Primary Examiner* — Selim U Ahmed
(74) *Attorney, Agent, or Firm* — Patterson + Sheridan, LLP

(57) ABSTRACT

An improved interconnect substrate having high density routings for a chip package assembly, a chip package assembly having a high density substrate, and methods for fabricating the same are provided that utilize substrates having a region of high density routings disposed over a region of low density routings. In one example, a method for fabricating an interconnect substrate is provided that includes forming a high density routing region by depositing a seed layer on a top surface of a low density routing region, patterning a mask layer on the seed layer, forming a plurality of conductive posts on the seed layer, removing the mask layer and the seed layer exposed between the conductive posts, and depositing a dielectric layer between the between the conductive posts, wherein at least some of the conduc- (Continued)

tive posts are electrically coupled to conductive routing comprising the low density routing region.

20 Claims, 14 Drawing Sheets

(51) Int. Cl.
*H01L 21/60* (2006.01)
*B23K 101/40* (2006.01)

100
102
106
108
112
114
116
118
120
122
130
132
134
140
142
144
146
150
152
154
156
158
160
162
164
170
180

HIGH DENSITY SUBSTRATE AND STACKED SILICON PACKAGE ASSEMBLY HAVING THE SAME

TECHNICAL FIELD

Examples of the present disclosure generally relate to a substrate for a chip package assembly, and in particular, to a substrate having high density routings for a chip package assembly, and a chip package assembly having the same.

BACKGROUND

Electronic devices, such as tablets, computers, copiers, digital cameras, smart phones, control systems and automated teller machines, among others, often employ electronic components which leverage chip package assemblies for increased functionality and higher component density. Conventional chip packaging schemes often utilize a package substrate, often in conjunction with a through-silicon-via (TSV) interposer, to enable a plurality of integrated circuit (IC) dies to be mounted to a single package substrate. The IC dies may include memory, logic or other IC devices.

In many chip package assemblies, high density routing on organic package substrates or interposers (collectively referred to as substrates) are utilized to satisfy the insatiable demand for improved performance at reduced costs. However, current technology requires a 2:1 pad to via size to provide reliable connections between vias in the routing formed in the substrate, thus constraining the density of the routing traces. Additionally, current via deposition technology often results in imperfect alignment between stacked vias, such promotes stress cracking and premature device failure. Constraints on routing density and via stress cracking is particularly problematic in applications where high band-width memory (HBM) and logic dies such as field programmable gate arrays (FPGA) are integrated in a single package assembly that require high density routing. In such applications, the memory and logic dies may operate at temperatures very close to the thermal junction temperature limit, which aggravate stress levels and lead to device failure.

Therefore, a need exists for an improved substrate having high density routings for a chip package assembly, and a chip package assembly having the same.

SUMMARY

An improved interconnect substrate having high density routings for a chip package assembly, a chip package assembly having a high density substrate, and methods for fabricating the same are provided that utilize substrates having a region of high density routings disposed over a region of low density routings. In one example, a method for fabricating an interconnect substrate for a chip package assembly is provided that includes forming a high density routing region by depositing a first seed layer on the top surface of a low density routing region, patterning a first mask layer on the first seed layer, forming a plurality of first conductive posts on the first seed layer, removing the first mask layer and the first seed layer exposed between the plurality of first conductive posts, and depositing a first dielectric layer between the between the plurality of first conductive posts, wherein at least some of the plurality of first conductive posts are electrically coupled to conductive routing comprising the low density routing region.

In another example, a method for fabricating a chip package assembly is also provided that includes attaching an IC die to a high density routing region formed on a top surface of the low density routing region, the high density routing region having a plurality of dielectric layers each having a thickness less than about 5 μm, the high and low density routing regions comprising part of an interconnect substrate; and reflowing solder interconnects disposed between the IC die and the interconnect substrate to mechanically and electrically couple circuitry of the IC die with circuitry of the interconnect substrate.

In another example, an interconnect substrate for a chip package assembly is provide. The interconnect substrate includes a low density routing region and a high density routing region. The low density routing region includes a bottom layer having exposed contact pads, a top surface, and interconnect routing coupling the contact pads exposed on the bottom layer. The high density routing region is disposed on the top surface of the low density routing region. The high density routing region includes a plurality of dielectric layers having a thickness less than about 5 μm, and a plurality of coaxially aligned vias extending through the plurality of dielectric layers.

In yet another example, a chip package assembly is provided that includes an interconnect substrate as described herein, and an integrated circuit die having exposed contact pads coupled by solder interconnects to the interconnect substrate. Solder of the solder interconnect is in direct contact with a surface of the vias exposed through the plurality of dielectric layers.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

Figure 1:
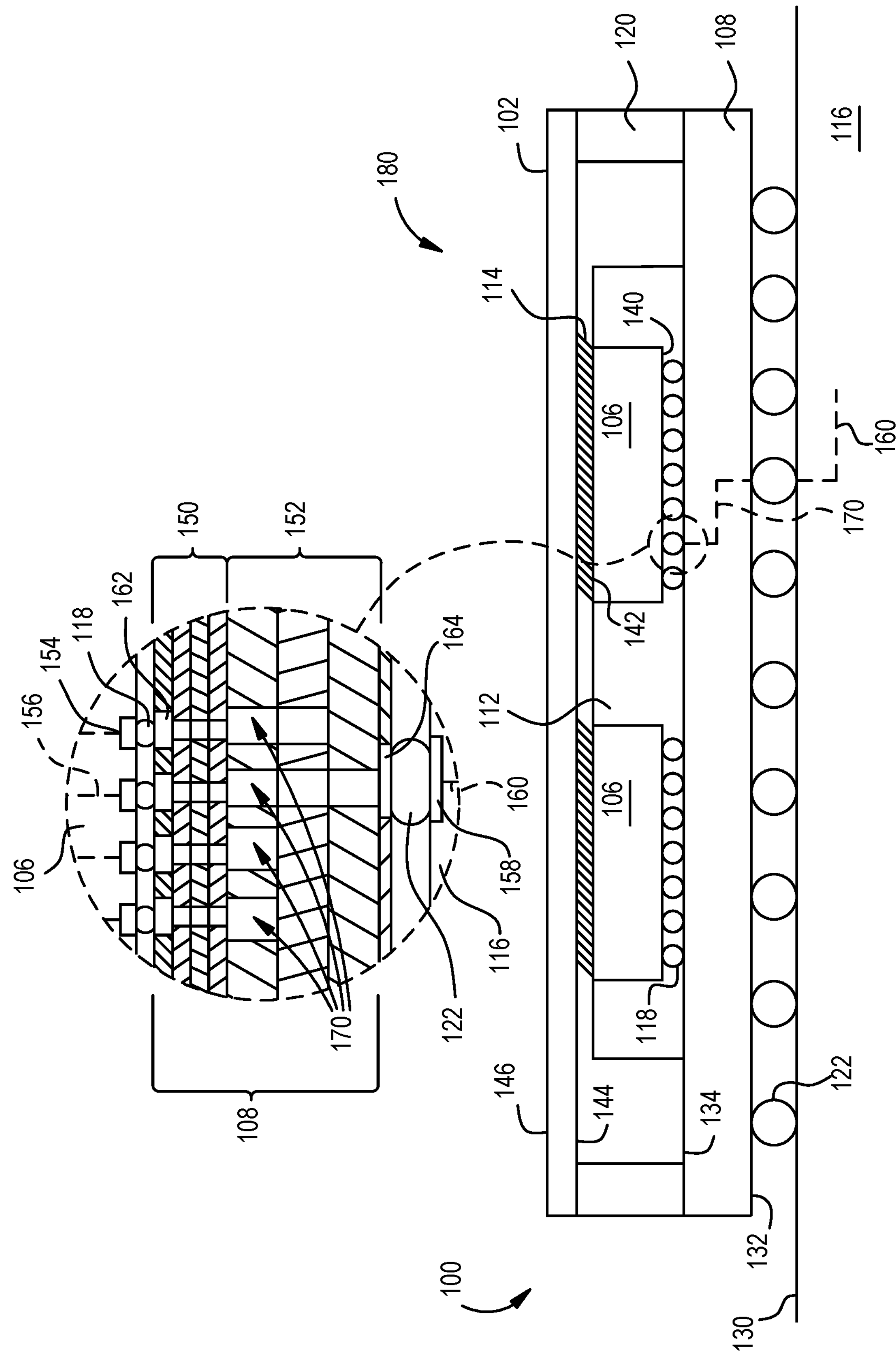
FIG. 1 is a schematic sectional view of a chip package assembly having a substrate that include a region of high density routings for coupling to integrated circuit (IC) dies disposed over a region of low density interconnects.

In the sectional views of the package substrate shown in FIGS. 2-3 and 5-13, layers of non-conductive material are cross hatched while layers of conductive material are not to minimize drawing clutter and for ease of understanding.

To facilitate understanding, identical reference numerals have been used, where possible, to designate identical elements that are common to the figures. It is contemplated that elements of one example may be beneficially incorporated in other examples.

DETAILED DESCRIPTION

An improved interconnect substrate having high density routings for a chip package assembly, a chip package assembly having a high density substrate, and methods for fabricating the same are provided. The substrates disclosed herein include a region of high density routings disposed over a region of low density routings. The region of high density routings includes thinner layers that do not require photoimageable dielectrics and vias that are precisely aligned that substantially reduce stress induced cracking. Furthermore, the precise alignment of vias enable solder connections between the substrate and integrated circuit (IC) dies to optionally be made without the use of contact pads, thus reducing the cost and complexity of manufacture while enabling even greater routing density due to the reduced size requirement. As a region of low density routings may be utilized in the substrate below the region of high density routings, further cost savings may be realized by leveraging the reduced density requirements on the printed circuit board side of the substrate to enable the use of cost effective conventional manufacturing techniques in non-critical areas of the substrate. Advantageously, the high density substrate and chip package assembly having the same improves reliability and performance with routing densities not commercially viable utilizing conventional manufacturing techniques. For example, thin dielectric layers comprising the region of high density routings enables signal traces to be disposed within a few microns of ground traces, thus reducing capacitive coupling and reducing cross-talk, while desirably improving the speed and reliability of signal transmission.

Turning now to FIG. 1, a schematic sectional view of a chip package assembly 100 that includes a package substrate 108 having high and low density routing regions 150, 152 utilized to provide power, ground and data signals to one or more integrated circuit (IC) dies 106 is schematically illustrated. It is contemplated that an interposer substrate (not shown) may be disposed between the IC dies 106 and the package substrate 108 may optionally be utilized and fabricated as with high and low density routing regions 150, 152 as described with reference to construction the package substrate 108 as detailed below. The optional interposer substrate and the package substrate 108 are both referred herein as interconnect substrates. The chip package assembly 100, when mounted to a printed circuit board (PCB) 116, forms part of an electronic device 180.

Although two IC dies 106 are shown in FIG. 1, the total number of IC dies may range from one to as many as can be fit within the chip package assembly 100. Examples of IC dies 106 that may be utilized in the chip package assembly 100 include, but are not limited to, programmable logic devices, such as field programmable gate arrays (FPGA), memory devices, such as high band-width memory (HBM), optical devices, processors or other IC logic structures. One or more of the IC dies 106 may optionally include optical devices such as photo-detectors, lasers, optical sources, and the like.

Each die 106 includes a bottom surface 140 and a top surface 142. The bottom surface 140 of the die 106 is coupled to a top surface 134 of the package substrate 108 by solder interconnects 118 or other suitable electrical connection.

The chip package assembly 100 also includes an optional cover 102 disposed over the IC dies 106. A bottom surface 144 of the cover 102 faces the top surface 142 of the die 106. Thermal interface material (TIM) 114 is disposed between the top surface 142 of the die 106 the bottom surface 144 of the cover 102 to enhance heat transfer therebetween. In one example, the TIM 114 may be a thermal gel or thermal epoxy, such as, packaging component attach adhesives available from AI Technology, Inc., located in Princeton Junction, N.J.

In some implementations, the cover 102 is fabricated from rigid material. In other implementations particularly where it is desirable to utilize the cover 102 to receive heat from the IC dies 106, the cover 102 is fabricated from a thermally conductive material, such as stainless steel, copper, nickel-plated copper or aluminum, among other suitable materials. A heat sink, not shown, may optionally be mounted to a top surface 146 of the cover 102.

The cover 102 may be structurally coupled to the package substrate 108 to increase the rigidity of the chip package assembly 100. Optionally, a stiffener 120 may be utilized to structurally couple the cover 102 to the package substrate 108. When used, the stiffener 120 may be made of ceramic, metal or other various inorganic materials, such as aluminum oxide ($Al_2O_3$), aluminum nitride (AlN), silicon nitride (SiN), silicon (Si), copper (Cu), aluminum (Al), and stainless steel, among other materials. The stiffener 120 can also be made of organic materials such as copper-clad laminate.

As discussed above, circuitry 156 of the IC dies 106 are connected to circuitry 170 of the package substrate 108 through the solder interconnects 118. The circuitry 170 of the package substrate 108 is similarly connected to circuitry 160 of the PCB 116. In the example depicted in FIG. 1, the top surface 134 of the package substrate 108 includes contact pads 162 that are is electrically and mechanically coupled to contact pads 154 formed on the bottom surface 140 of the IC dies 106. The contact pads 154 are coupled to the circuitry 156 of the IC dies 106, while the contact pads 162 are coupled to circuitry 170 of the package substrate 108. circuitry 170 of the package substrate 108

As mentioned above, the chip package assembly 100 may be mounted to a printed circuit board (PCB) 116 to form an electronic device 180. Similarly, contact pads 164 formed on a bottom surface 132 of the package substrate 108 are electrically and mechanically coupled to contact pads 158 formed on a top surface 130 of the PCB 116 by solder balls 122 or other suitable connection. The contact pads 164 are coupled to the circuitry 170 of the package substrate 108, while the contact pads 158 are coupled to circuitry 160 of the PCB 116.

Dielectric filler 112 is disposed on the package substrate 108 between the dies 106. The dielectric filler 112 provides additional rigidity to the package assembly 100, while also protecting the solder interconnects 118. The dielectric filler 112 may be an epoxy-based material or other suitable material. The dielectric filler 112 may additionally include fillers, for example, inorganic fillers such as silica ($SiO_2$). In one example, the dielectric filler 112 may have a CTE between about 20 to about 40 ppm/degree Celsius, a viscosity of between about 5 to about 20 Pascal-seconds, and a Young's modulus of between about 6 to about 15 Pascal (Pa).

In one example, the dielectric filler 112, prior to curing, has a viscosity suitable to flow into and fill the interstitial space between the bottom surface 140 of the dies 106 and the top surface 134 of the package substrate 108 around the solder interconnects 118. Alternatively, a separate underfill material may be used to fill the interstitial space the bottom surface 140 of the dies 106 and the top surface 134 of the package substrate 108 around the solder interconnects 118, while the dielectric filler 112 is disposed over the underfill and fills the interstitial space between adjacent dies 106.

As noted above, the package substrate 108 has high and low density routing regions 150, 152. The high density routing region 150 includes a plurality of interconnect layers fabricated in a manner that allows higher density of conductors (i.e., vias and routing line) as compared to the conductors comprising the low density routing region 152. The low density routing region 152 also includes a plurality of interconnect layers. However, the interconnect layers of the low density routing region 152 are generally thicker than the interconnect layers of the high density routing region 150. The thinner layers of the low density routing region 152 reduce cross talk and signal-to-noise ratio (SNR) when conductors within the region 152 are organized in a data-ground-data-ground arrangement. One example of the package substrate 108 is further detailed below with reference to FIG. 2.

Figure 2:
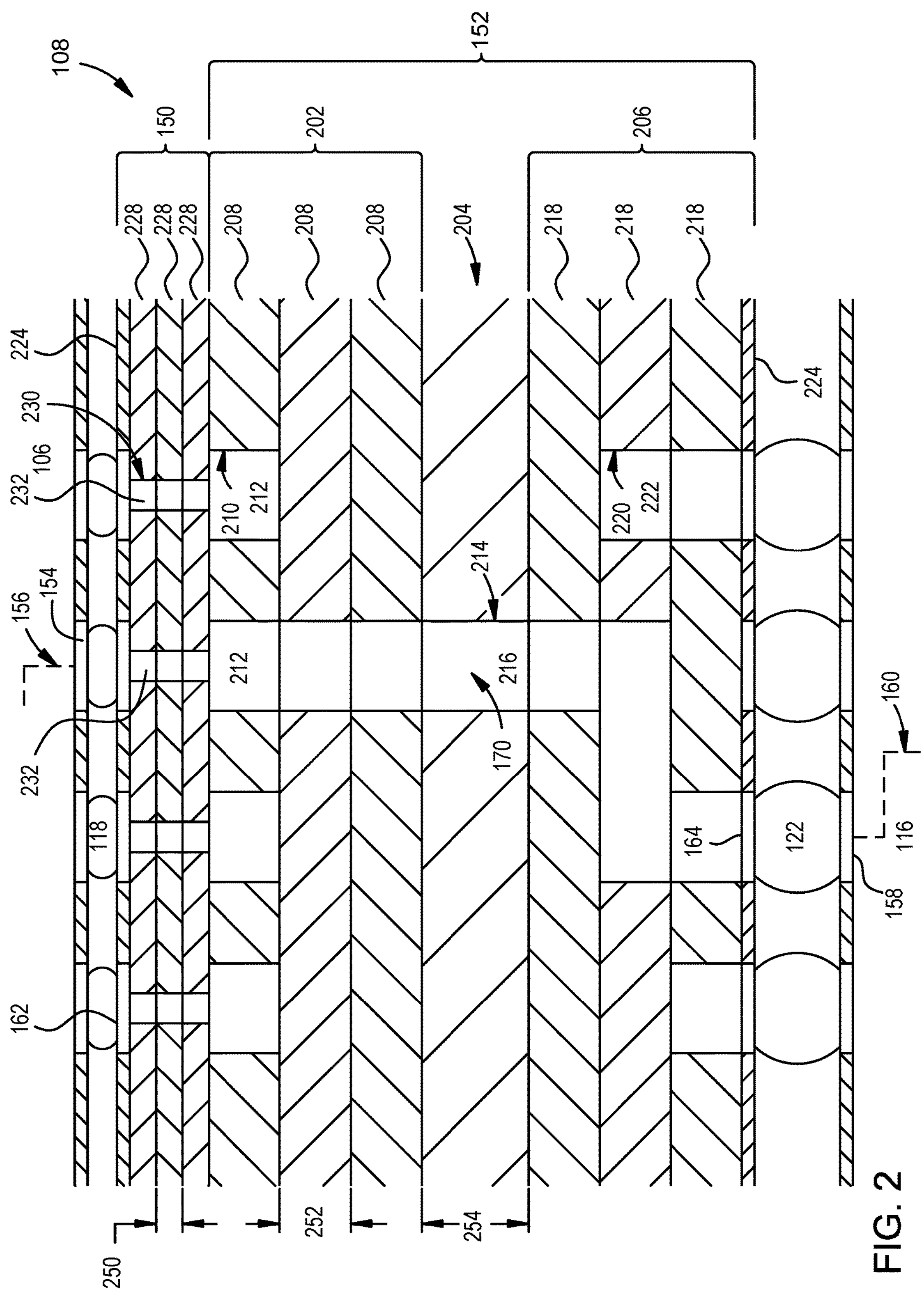
FIG. 2 is a schematic partial sectional view of a portion of the chip package assembly of FIG. 1 detailing the structure of the interconnect substrate.

FIG. 2 is a schematic partial sectional view of a portion of the chip package assembly 100 of FIG. 1 detailing the structure of the package substrate 108. The low density routing region 152 of the package substrate 108 includes a first build-up region 202, a core substrate 204 and a second build-up region 206 through which the circuitry 170 is routed. In some embodiments, the core substrate 204 may not be present, in which case the first and second build-up regions 202, 206 are formed adjacent each other.

The core substrate 204 is fabricated from a rigid dielectric material. Suitable materials for used as the core substrate 204 include an inorganic materials, such as silicon, ceramic or other suitable rigid dielectric material. The core substrate 204 generally has a thickness 254, which in most embodiments, is thicker than the other layers comprising the package substrate 108. The core substrate 204 includes a plurality of vias 214 (one of which is shown in FIG. 2). The vias 214 are filled with an electrically conductive material 216, such as copper, which form part of the electrical routing of the circuitry 170 extending through the package substrate 108.

The first build-up region 202 includes a plurality of non-conductive (e.g., dielectric) layers 208 through which electrical routing 212 is formed. The electrical routing 212, which is part of the circuitry 170 of the package substrate 108, is formed from copper or other suitable electrically conductive material. The electrical routing 212 generally includes vias and lines that form a metal interconnect. In the embodiment illustrated in FIG. 2, portions of the electrical routing 212 are disposed in holes 210 formed in the layers 208. The holes 210 may be formed by laser drilling or other suitable method. The electrical routing 212 may be deposited in the holes 210, for example, by plating. The electrical routing 212 is coupled to the conductive material 216 of the core substrate 204 as part of the circuitry 170.

The second build-up region 206 includes a plurality of dielectric layers 218 through which electrical routing 222 is formed. The electrical routing 222, which is part of the circuitry 170 of the package substrate 108, is formed from copper or other suitable electrically conductive material. The electrical routing 222 generally includes vias and lines that form a metal interconnect. In the embodiment illustrated in FIG. 2, portions of the electrical routing 222 are disposed in holes 220 formed in the layers 218. The holes 220 may be formed by laser drilling or other suitable method. The electrical routing 222 may be deposited in the holes 220, for example, by plating. The electrical routing 222 is coupled to the electrical routing 212 by the conductive material 216 of the core substrate 204 as part of the circuitry 170. The electrical routing 222 generally terminates at the contact pad 164. The contact pads 164 may be laterally separated by a solder mask 224 or other dielectric material.

The dielectric layers 208, 218 are formed from an electrically insulative material. Each of the dielectric layers 208, 218 may be fabricated from dielectric resin. Each of the dielectric layers 208, 218 have a thickness 252. The thickness 252 of the dielectric layers 208, 218 is generally less than the thickness 254 of the core substrate 204.

The high density routing region 150 is disposed on and in direct contact with the first build-up region 202. The high density routing region 150 includes a plurality of dielectric layers 228 through which electrical routings 232 are formed. In one example, at least 3 dielectric layers 228 are utilized in the high density routing region 150.

The electrical routings 232, which are part of the circuitry 170 of the package substrate 108, are formed from copper or other suitable electrically conductive material. The electrical routings 232 generally includes vias and lines that form a metal interconnect. In the embodiment illustrated in FIG. 2, portions of the electrical routing 232 are disposed in holes 230 formed in the layers 228, and as such, the portion of the electrical routing 232 disposed in holes 230 may be referred to as a "conductive post 232" or "via 232". As further discussed below, the holes 230 are generally formed around the conductive posts 232 after the conductive posts 232 have been formed. The electrical routing 232 is coupled to the electrical routing 212, and by the conductive material 216 and routing 222 to the contact pad 162 of the package substrate 108. In one example, the electrical routing 232 terminates at the contact pads 162. The contact pads 162 may be laterally separated by a solder mask 224 or other dielectric material. In other examples, the pads 162 may be optional, and the electrical routing 232 may be in direct contact with the solder interconnect 118.

The dielectric layers 228 are formed from an electrically insulative material. In one example, the material forming the dielectric layers 228 is different than that utilized to form the dielectric layers 208, 218. Suitable materials for forming the dielectric layers 228 include non-photoimageable materials, such as non-photoimageable polyoxazole, non-photoimageable polyimide, and non-photoimageable epoxy, among others. Each of the dielectric layers 228 has a thickness 250. The thickness 250 of the dielectric layers 228 is generally less than the thickness 252 of the dielectric layers 208, 218. Since the dielectric layers 228 include non-photoimageable materials, the dielectric layers 228 are much more dimensionally stable and less susceptible to shrinkage and warpage as compared to photoimageable materials.

Figure 3:
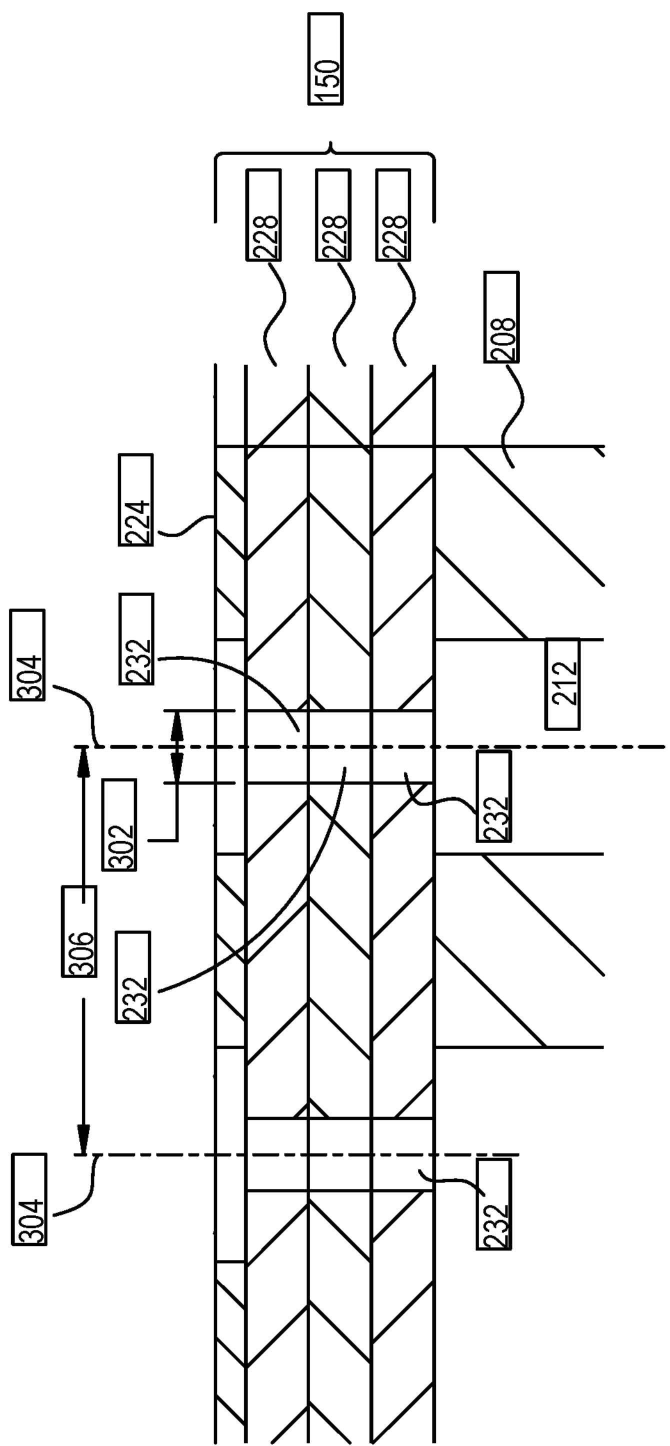
FIG. 3 is an enlarged schematic sectional view of a portion of the region of high density routings of the interconnect substrate depicted of FIG. 2.

FIG. 3 is an enlarged schematic sectional view of a portion of the region 150 of high density routings of the package substrate 108 depicted of FIG. 2. As discussed above, the high density routing region 150 includes electrical routings 232, the examples of which shown in FIG. 3 are in the form of vias (i.e., conductive posts 232). The conductive posts 232 comprising a portion of the electrical routings 232 can have a pitch 306, measured laterally from via centerline 304 to via centerline 304 of less than 250 μm, such as for example less than 150 μm. The conductive posts 232 comprising a portion of the electrical routings 232 may be stacked one on top of another such that the centerlines 304 of the stacked vias are substantially co-linear, for example, within plus or minus 1.0 μm. The stacked conductive posts 232 comprising a portion of the electrical routings 232 are also very uniform in cross section, for example having diameters 302 that are within plus or minus 1.0 μm. Furthermore, the highly co-linear and uniform vias enable the contact pads 162 to be smaller in size or even eliminated, thus further contributing to enabling the pitch 306 to be smaller, and thus allowing high density of the conductive posts 232. The highly co-linear and uniform conductive posts 232 are also very crack resistant as compared to conventional via designs, thus resulting in a very robust interconnect substrate and ultimately, a robust and reliable chip package assembly 100.

Figure 4:
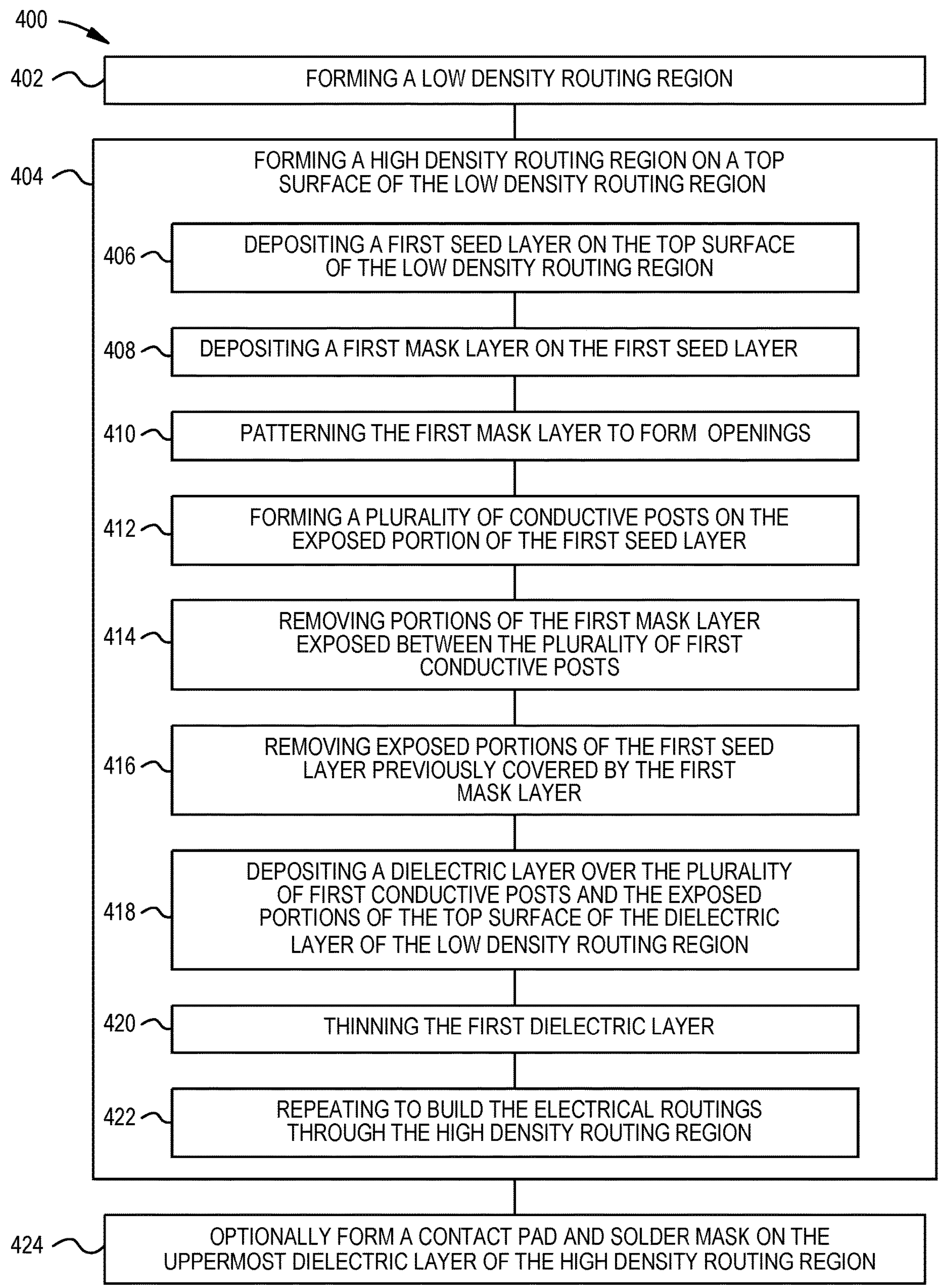
FIG. 4 is a flow diagram of a method for fabricating an interconnect substrate that include a region of high density routings for coupling to integrated circuit (IC) dies disposed over a region of low density interconnects.

FIG. 4 is a flow diagram of a method 400 for fabricating an interconnect substrate that include a region 150 of high density routings for coupling to integrated circuit (IC) dies 106 disposed over a region 152 of low density interconnects. FIGS. 5-13 are schematic sectional views of an interconnect substrate, such as a package substrate 108, during various stages of fabrication according to the method of FIG. 4.

Figure 5:
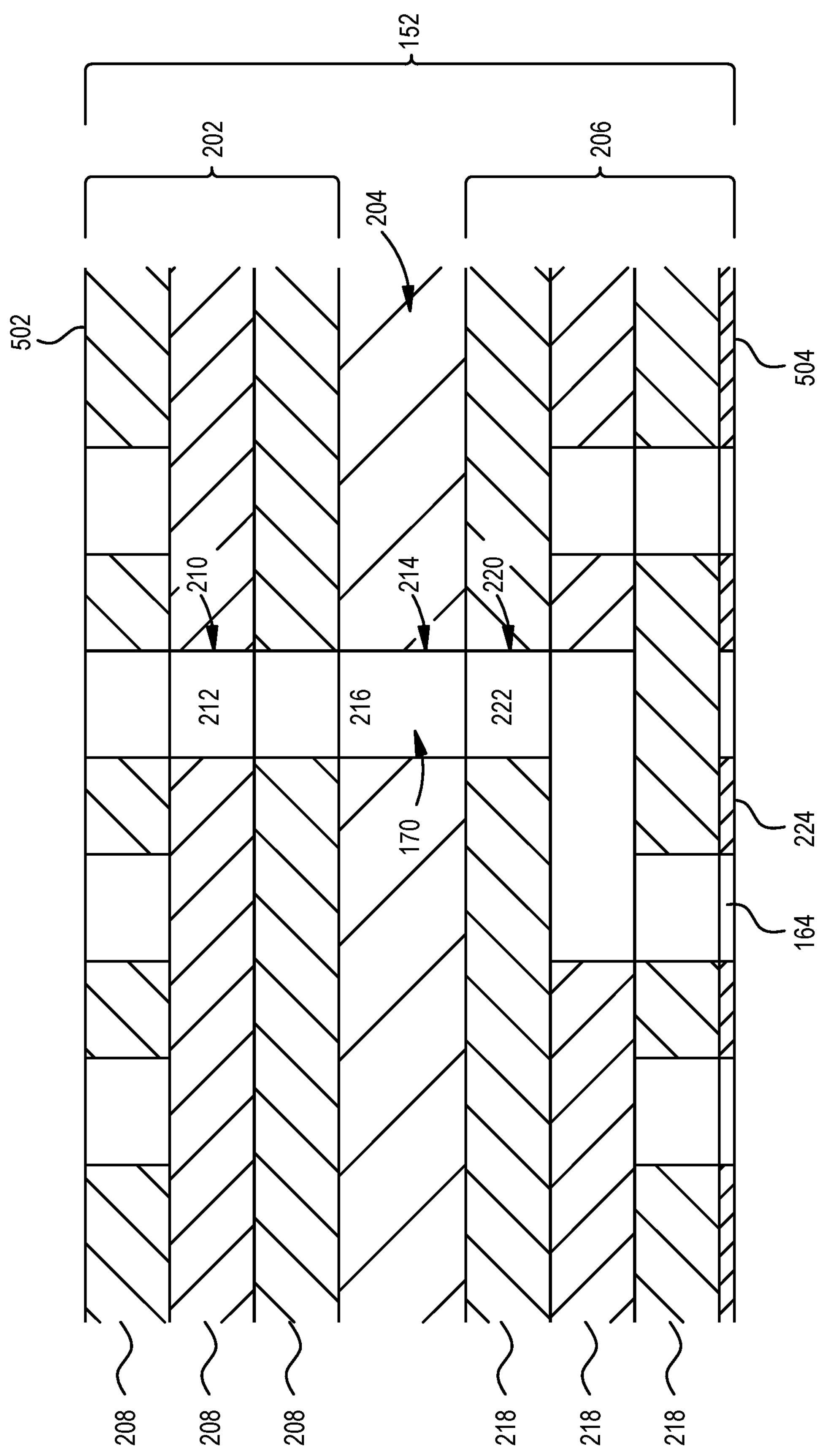
FIGS. 5-13 are schematic sectional views of an interconnect substrate during various stages of fabrication according to the method of FIG. 4.

The method 400 for fabricating an interconnect substrate for a chip package assembly begins at operation 402 by forming a low density routing region 152. As depicted in FIG. 5, the low density routing region 152 includes forming a first build-up region 202 and a second build-up region 206 on opposite sides of a core substrate 204. The first and second build-up regions 202, 206 include depositing multiple dielectric layers 208, 218 through which electrical circuitry 170 is routed. The dielectric layers 208, 218 may be spun on or deposited on the core 204 by other suitable methods. The electrical circuitry 170 is in the form of vias and lines that are plated in holes 210, 220, 230 formed, for example by laser drilling, though the layers 208, 218 and core substrate 204.

At operation 404, a high density routing region 150 is formed on a top surface 502 of the low density routing region 152. The top surface 502 of the low density routing region 152 is configured to face the dies 106 after fabrication, while a bottom surface 504 is configured to face the printed circuit board 116. Forming the high density routing region 150 at operation 404 includes a plurality of sub-operations that are repeatedly performed to form the metal interconnect that comprises the portion of the circuitry 170 (i.e., the electrical routing 232) routed through the high density routing region 150.

Figure 6:
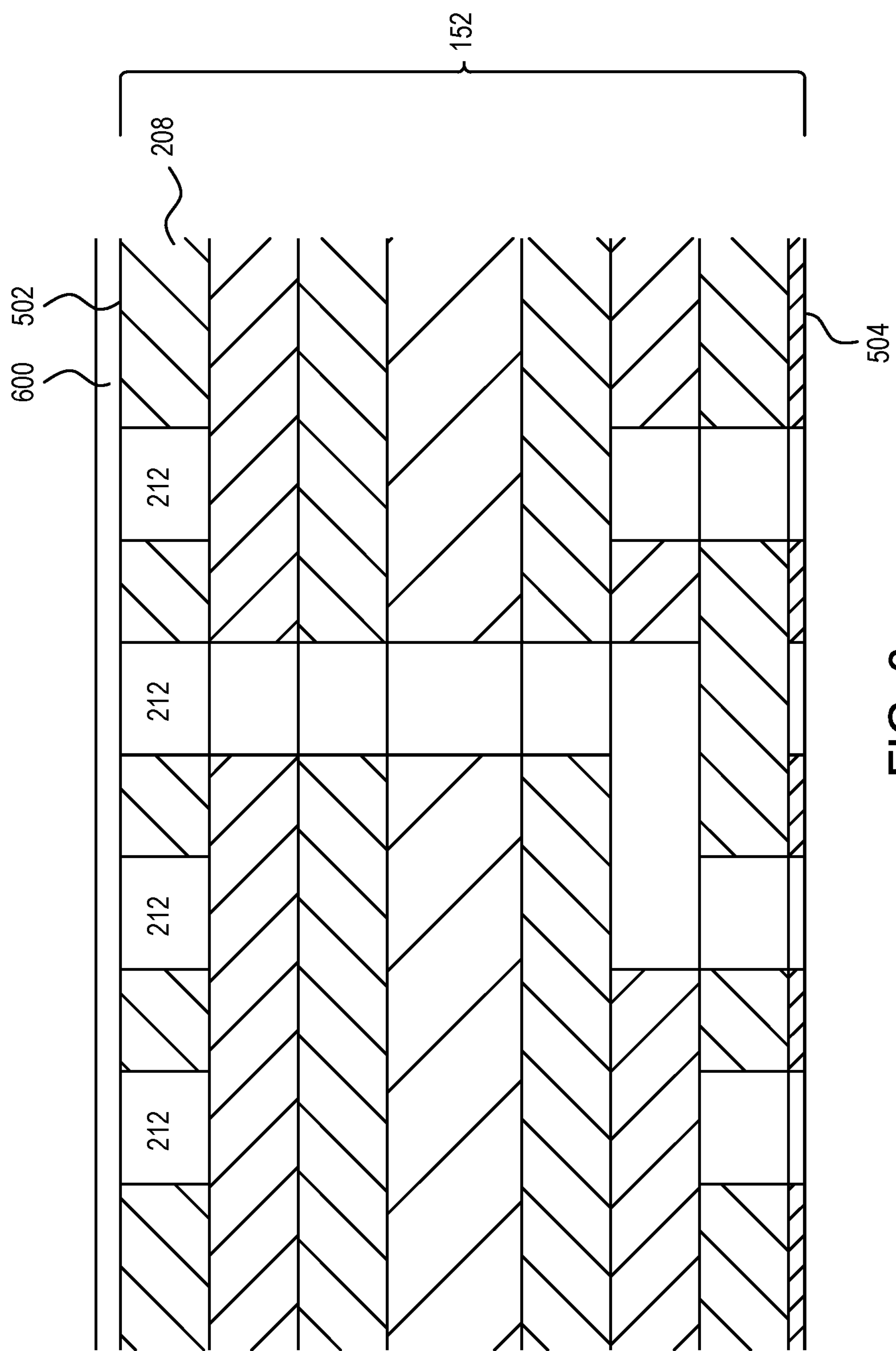

Forming the high density routing region 150 begins at sub-operation 406 by depositing a first seed layer 600 on the top surface 502 of the low density routing region 152, as illustrated in FIG. 6. The first seed layer 600 may be a copper layer or other metal or metallic layer suitable for facilitating plating of an electrically conductive material thereon. In the example depicted in FIG. 6, the first seed layer 600 is copper which is deposited by a physical vapor deposition (PVD) or a chemical vapor deposition (CVD) or other suitable process. The first seed layer 600 is in contact with the electrical routing 212 of the first build-up region 202.

Figure 7:
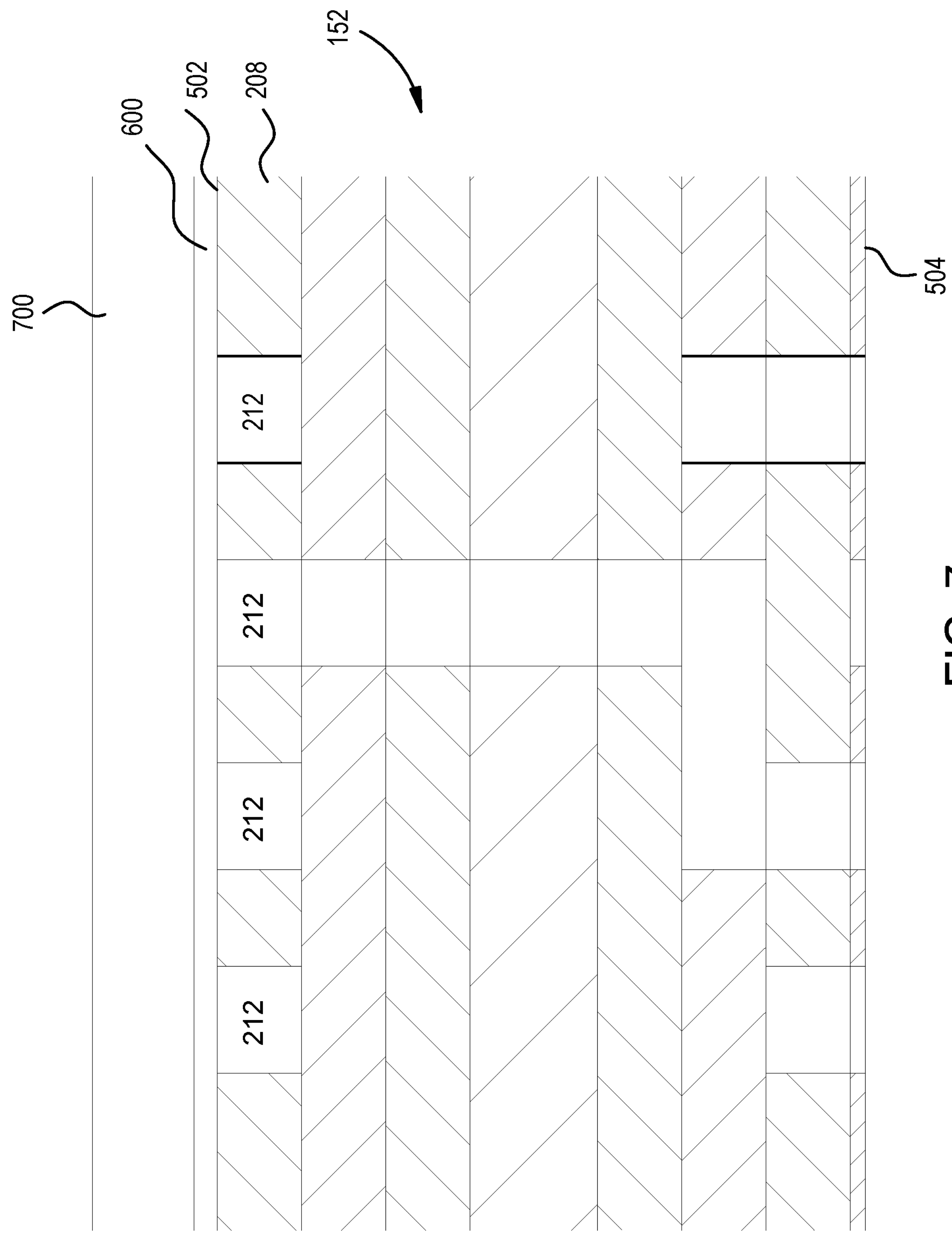

At sub-operation 408, a first mask layer 700 is deposited on the first seed layer 600. The first mask layer 700 is a photoresist material, and in the example illustrated in FIG. 7, is a polymeric resist material that is spun on the first seed layer 600.

Figure 8:
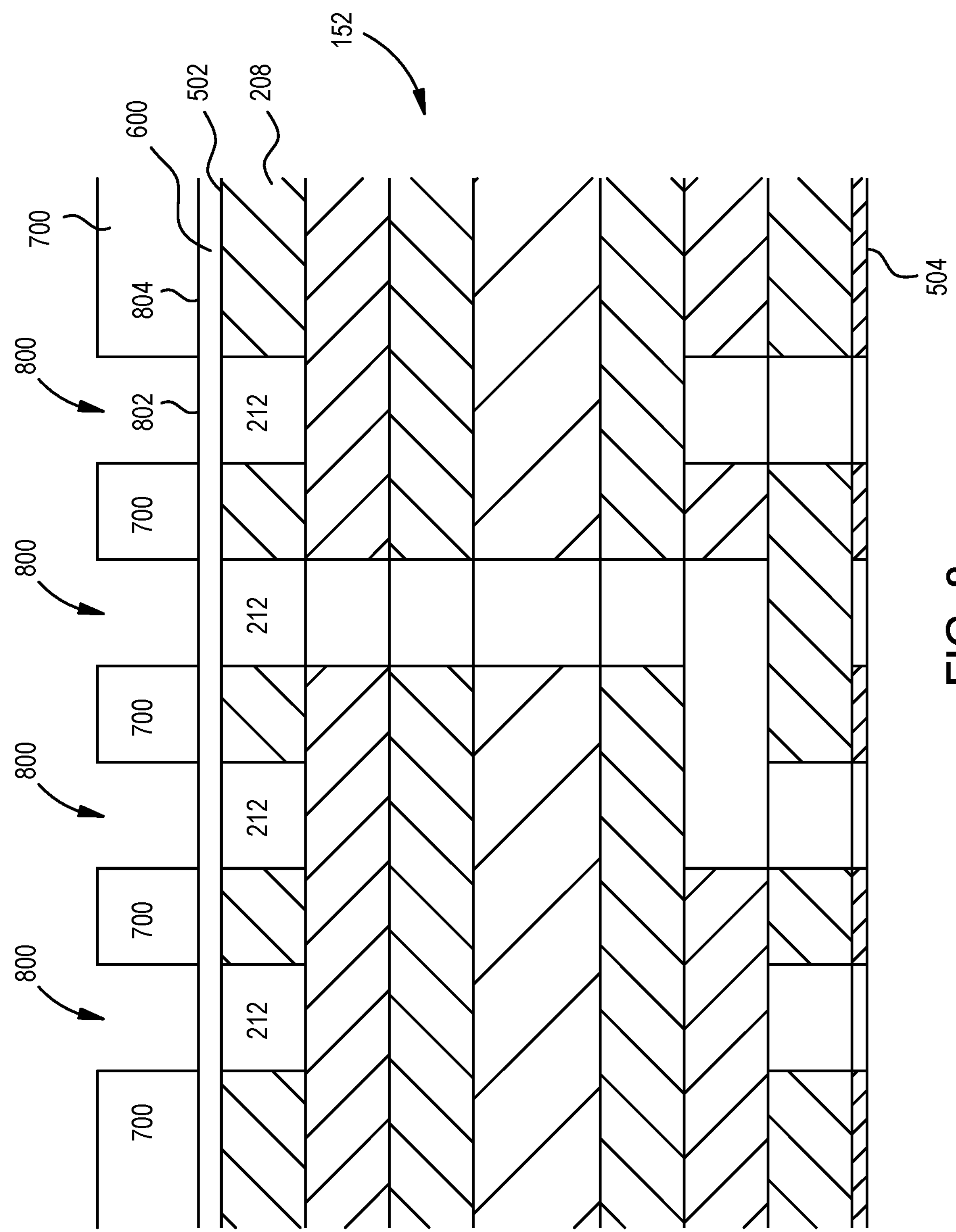

At sub-operation 410, the first mask layer 700 is patterned to form openings 800. As illustrated in FIG. 8, the openings 800 formed in the first mask layer 700 expose a first (i.e., exposed) portion 802 of the first seed layer 600 where the material of the first mask layer 700 has been removed. A second (i.e., covered) portion 804 of the first seed layer 600 remains covered by the first mask layer 700 after patterning at sub-operation 410. The first mask layer 700 may be patterned by direct imaging, laser ablation, photolithography or other suitable technique.

Figure 9:
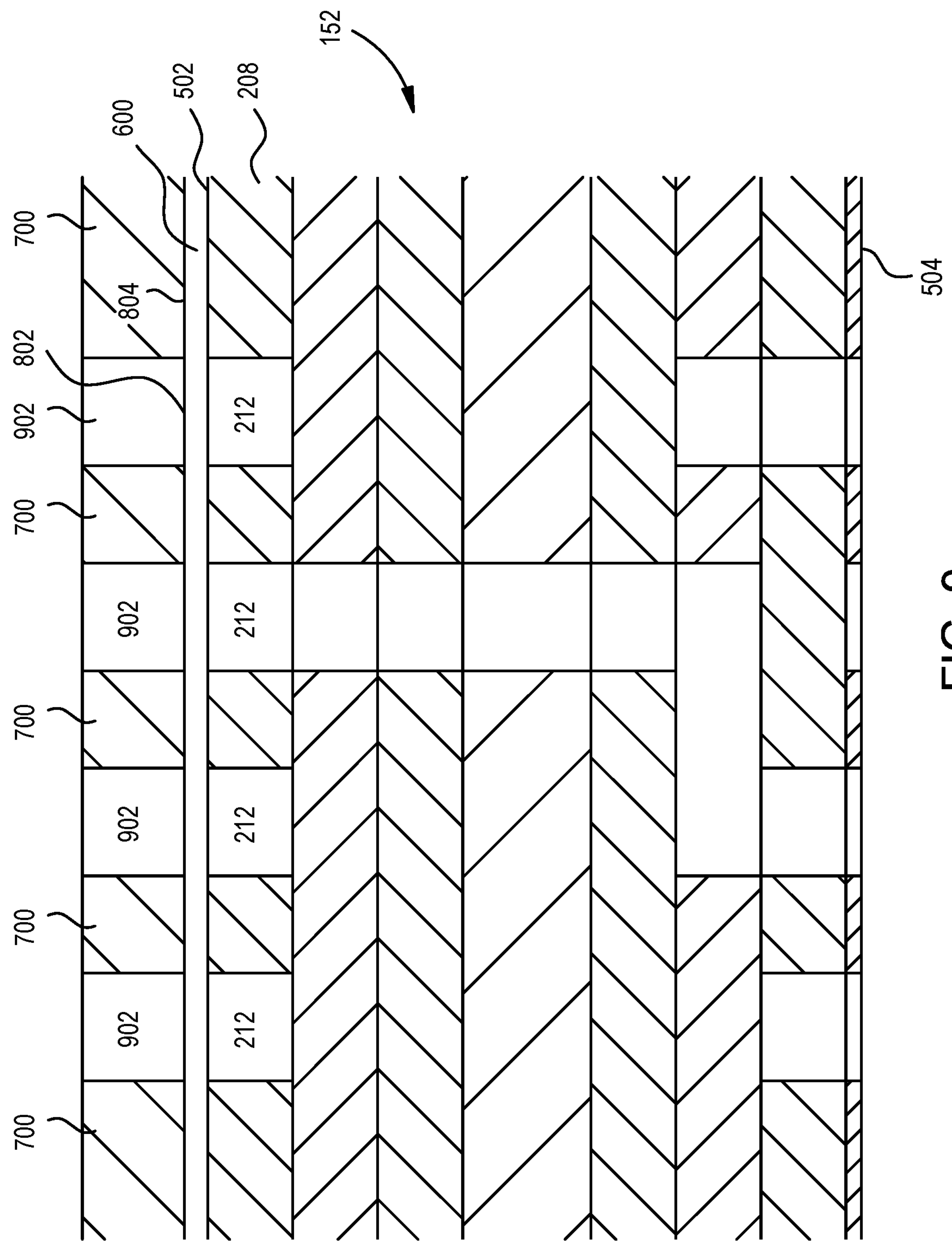

At sub-operation 412, a plurality of conductive posts 902 are formed on the exposed portion 802 of the first seed layer 600 as illustrated in FIG. 9. The first conductive posts 902 may be formed from copper, nickel, cobalt, tungsten, or other electrically conductive material suitable for data, ground and power transmission as part of the circuitry 170 of the package substrate 108. In the example depicted in FIG. 9, the first conductive posts 902 are electroplated on the exposed portion 802 of the first seed layer 600.

Figure 10:
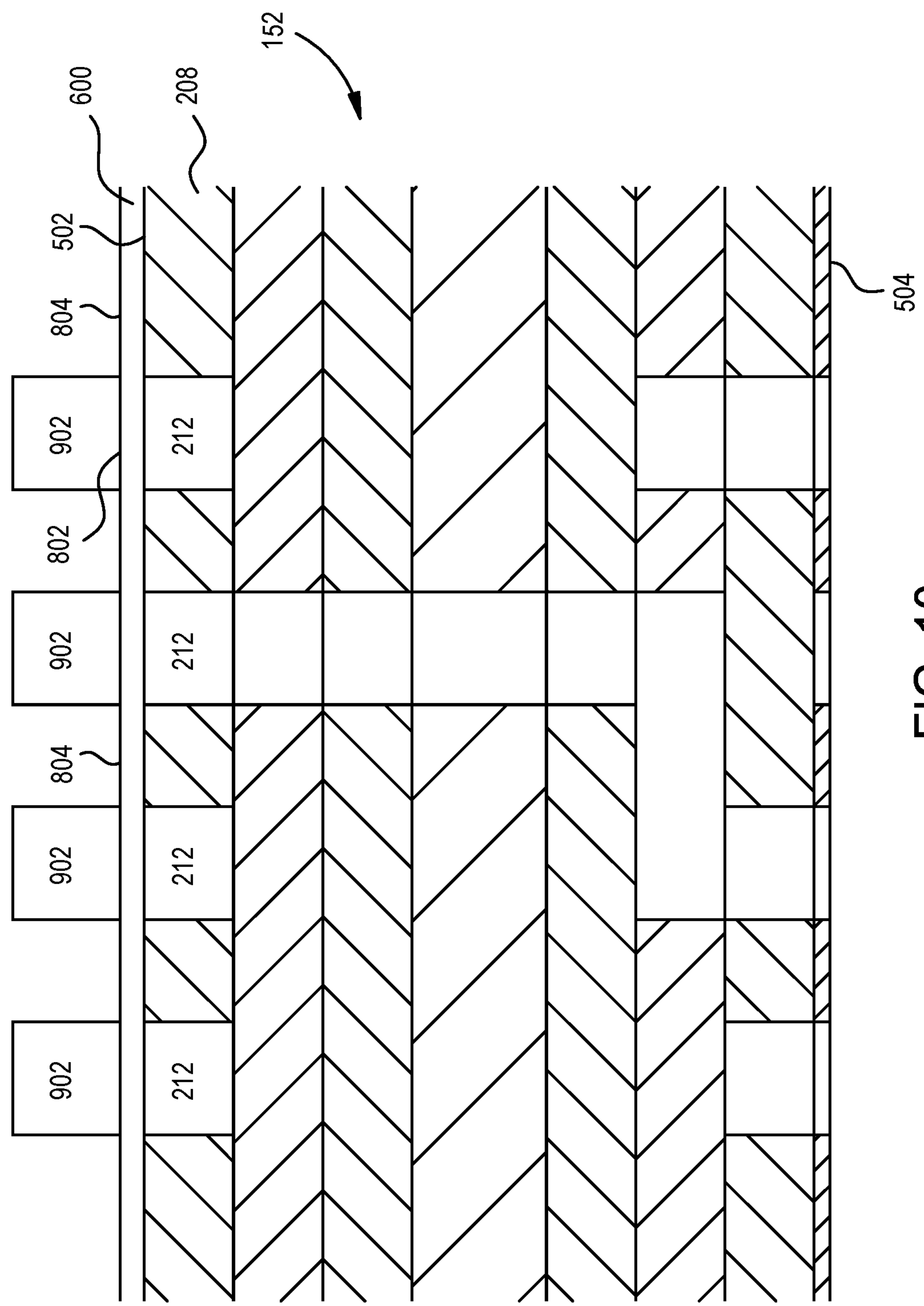
Figure 11:
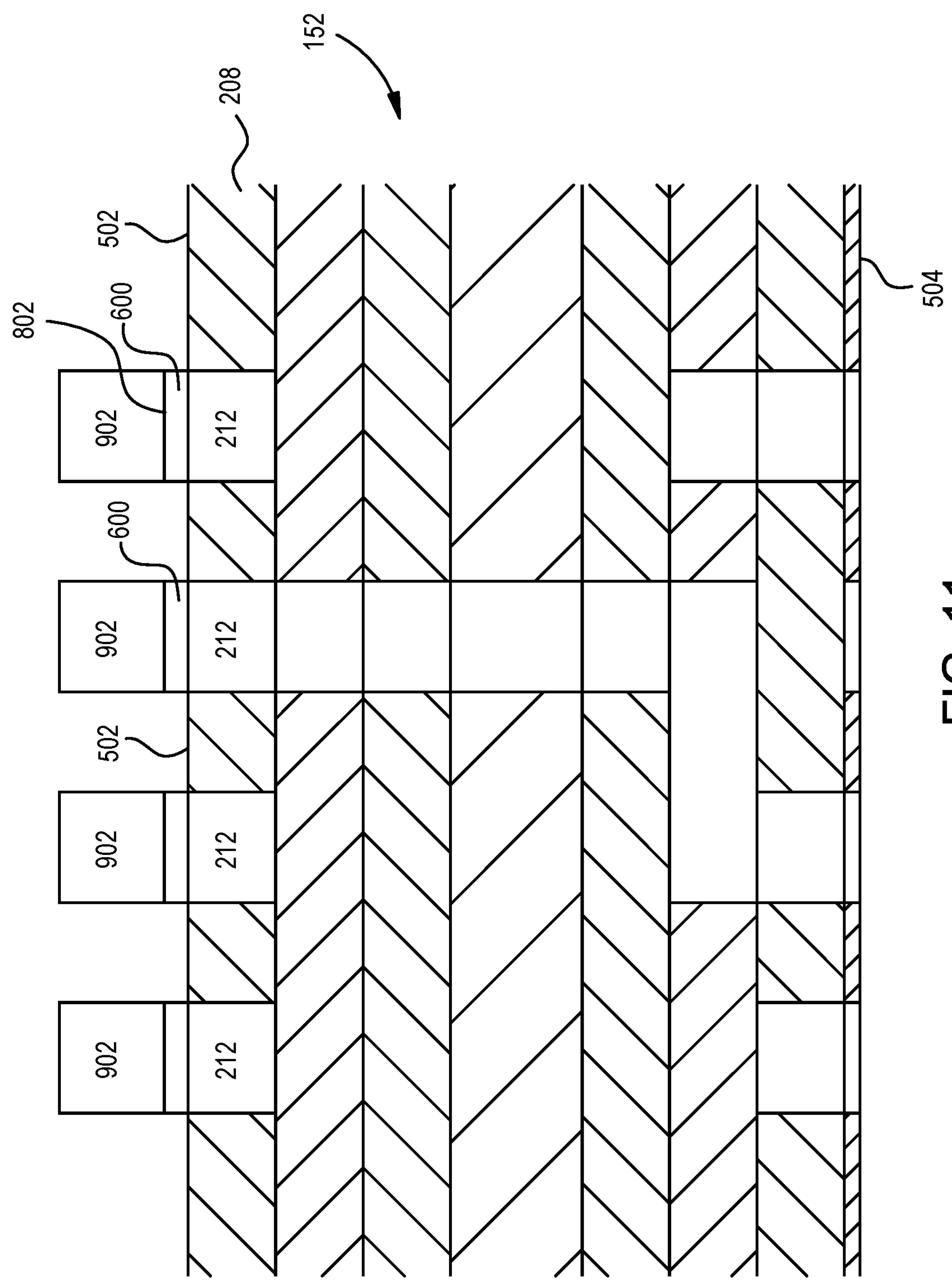

At sub-operation 414, portions of the first mask layer 700 exposed between the plurality of first conductive posts 902 are removed as illustrated in FIG. 10. The first mask layer 700 may be removed by ashing, etching or other suitable technique. Once the first mask layer 700 has been removed, the portion 804 of the first seed layer 600 previously covered by the first mask layer 700 is now exposed and can be removed by etching, laser ablation or other suitable technique at sub-operation 416. Once the portion 804 of the first seed layer 600 is removed, only the portion 802 of the first seed layer 600 remains between the post 902 and the electrical routing 232, thereby becoming part of the circuitry 170 of the package substrate 108, as illustrated in FIG. 11.

Figure 12:
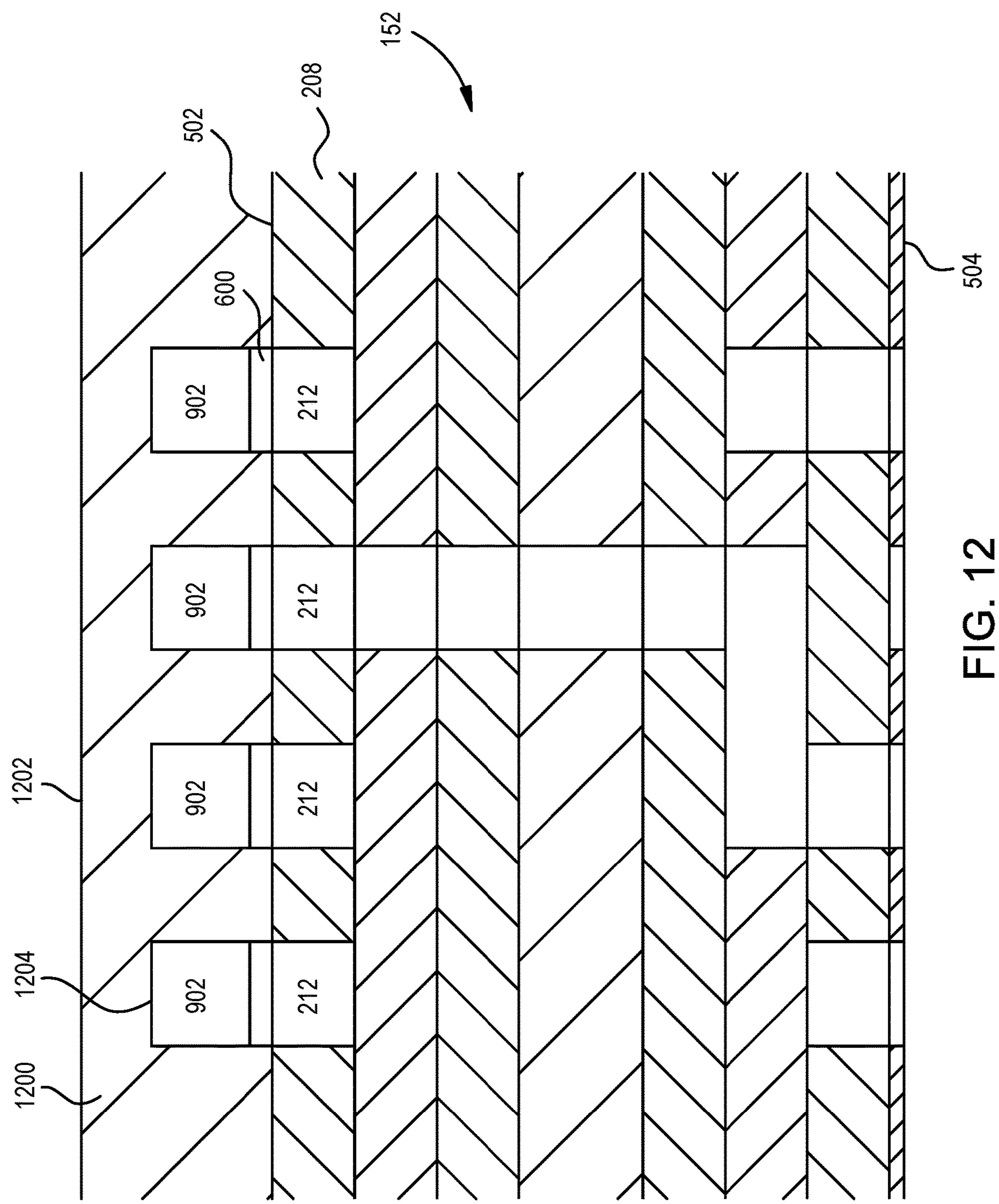

At sub-operation 418, a dielectric layer 1200 of what will become one of the dielectric layers 228 is deposited over the plurality of first conductive posts 902 and exposed portions of the top surface 502 of the dielectric layer 208 of the low density routing region 152. As illustrated in FIG. 12, the first dielectric layer 1200 has a top surface 1202 that is disposed above a top surface 1204 of the first conductive posts 902. In one example, the first dielectric layer 1200 is spun-on the top surfaces 502, 1202 of the dielectric layer 208 and conductive posts 902. In another example, the first dielectric layer 1200 may be deposited by chemical vapor deposition (CVD) or other suitable technique.

Figure 13:
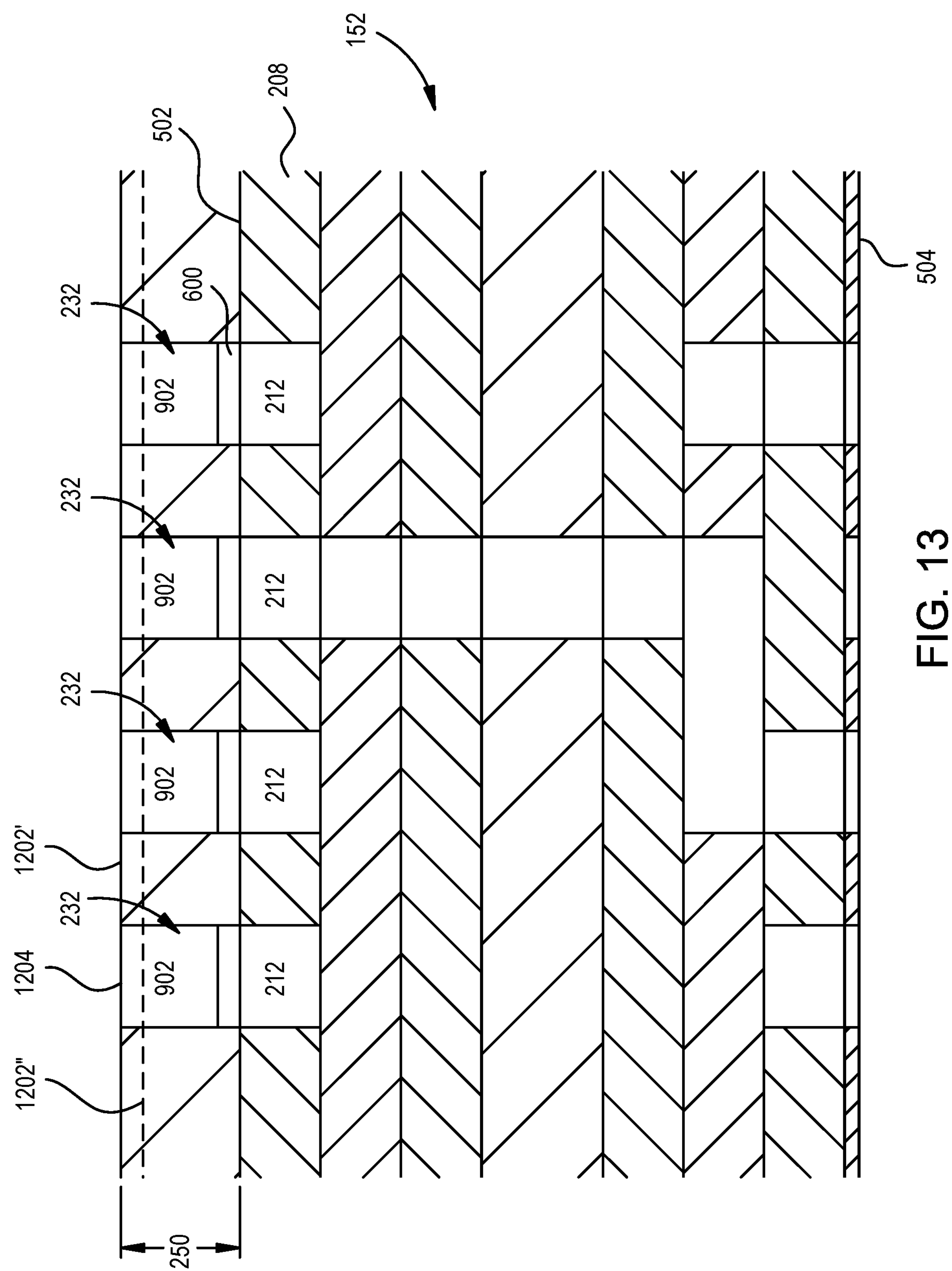

At sub-operation 420, the top surface 1202 of the first dielectric layer 1200 shown in FIG. 12 is removed to thin the dielectric layer 1200 at least until the top surface 1204 of the conductive posts 902 becomes exposed through the thinned top surface 1202' as shown in FIG. 13. For example, the first dielectric layer 1200 may be thinned by fly-cutting, etching, grinding, polishing or other suitable technique. In one example, the thickness of the dielectric layer 1200 may be reduced below the top surface 1204 of the conductive post 902 as formed is illustrated by dashed line 1202". In such an example, the height of the conductive posts 902 are also reduced such that the surface represented by dashed line 1202" and the top of the conductive posts 902 remain substantially coplanar.

In one example, the dielectric layer 1200 is thinned to a thickness 250 of less than about 5 μm. In another example, the dielectric layer 1200 is thinned to a thickness 250 between 2 μm to 4 μm. The stacked height of the conductive post 902/seed layer 600 pair is substantially equal to the thickness 250 of the dielectric layer 1200. Once the dielectric layer 1200 is thinned, the dielectric layer 1200 becomes the dielectric layer 228. The thin dielectric layer 228 advantageously allows the electric routing 232 that are configured to be coupled to ground to be closely spaced from the electric routing 232 that are configured to carry electrical (i.e., data) signals, which particularly in a signal-ground-signal configuration significantly reduces cross-talk and improves the signal to noise ratio of the package substrate 108. After sub-operation 420, the stacked conductive post 902/seed layer 600 pair form the first conductive post 232 of the electrical routing 232 that is in contact with the electrical routing 212.

At sub-operation 422, sub-operations 406-420 are repeated one or more times to build the electrical routings 232 through the high density routing region 150. Once the electrical routings 232 through each of the dielectric layers 228 of the high density routing region 150 have been formed to configure the desired electrical paths, operation 404 is complete. In one example, the sub-operation 422 is repeated at least two times such that three dielectric layers 228 (i.e., a first dielectric layer 228, a second dielectric layer 228, and a third dielectric layer 228) are utilized to form the high density routing region 150. In another example, sub-operation 422 co-axially stacks at least three vias formed by the electrical routing 232 in each of the dielectric layers 228 (as shown by the stacked electrical routing 232 (i.e., a first conductive post 232, a second conductive post 232, and a third conductive post 232) illustrated in FIG. 2). Since the second mask layer 700 is patterned and opened to precisely expose the top of the first conductive post 232, the second conductive post 232 is precisely plated thereon when enables precise alignment and diameter matching which cannot be achieved with conventional fabrication techniques.

After the sub-operation 422 has completed, an optional sub-operation 424 may be performed. At sub-operation 424, a contact pad 162 and solder mask 224 are formed on the uppermost dielectric layer 228. The contact pad 162 is formed on and is electrically coupled to the electrical routing 232. The contact pad 162 provides an attachment point for solder connecting the package substrate 108 to the dies 106. The contact pads 162 are generally separated by the solder mask 224. Sub-operation 424 may be omitted if the solder connections (i.e., solder micro-bumps) are directly deposited on the surface of the uppermost electric routing exposed through the uppermost dielectric layer 228 farthest from the core substrate 204.

Figure 14:
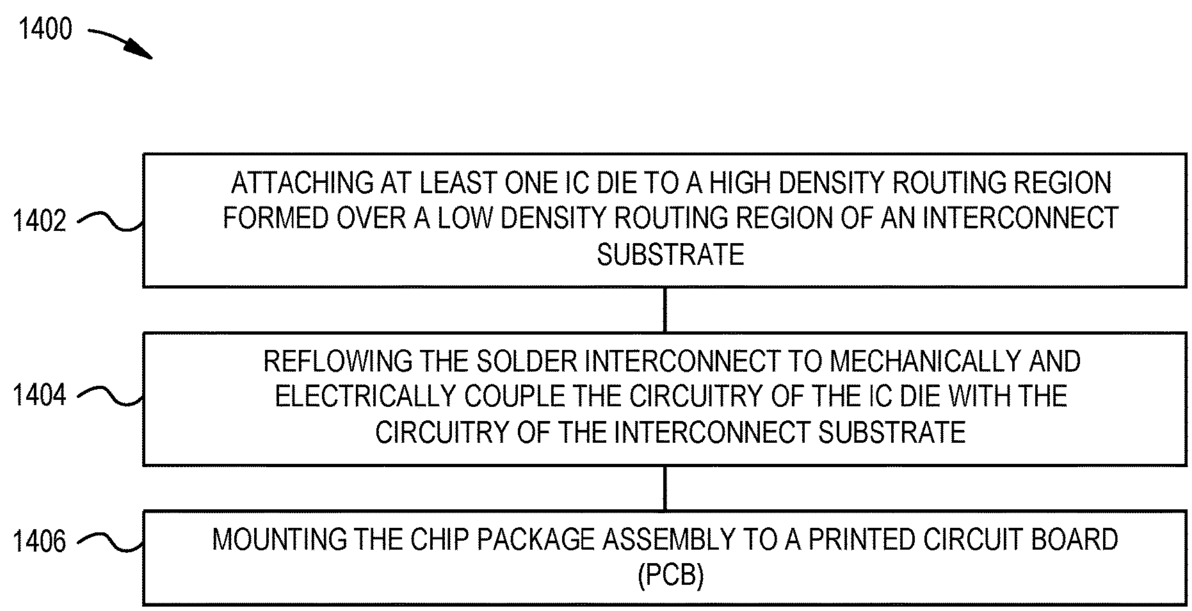
FIG. 14 is a flow diagram of a method for fabricating a chip package assembly having an interconnect substrate that include a region of high density routings for coupling to integrated circuit (IC) dies and a region of low density interconnects for coupling to a package substrate or printed circuit board.

FIG. 14 is a flow diagram of a method 1400 for fabricating a chip package assembly 100 having an interconnect substrate, such as a package substrate 108, that include a region of high density routings 150 for coupling to integrated circuit (IC) dies 106 and a region of low density interconnects 152 for coupling to a printed circuit board (PCB) 116. The method 1400 begins at operation 1402 by attaching at least one IC die 106 to a high density routing region 150 formed over a low density routing region 152 of an interconnect substrate, such a package substrate 108. The die 106 may be attached utilizing solder interconnects 118 or other suitable technique. At operation 1404, the solder interconnects 118 are reflowed to mechanically and electrically couple the circuitry 156 of the IC die 106 with the circuitry 170 of the package substrate 108.

In one example, operations 1402 and 1404 may be utilized to electrically and mechanically attached one or more memory dies 106 to the high density routing region 150 of the package substrate 108, and to electrically and mechanically attached one or more logic dies 106, such as FPGA dies, to the high density routing region 150 of the package substrate 108. Thus, operations 1402, 1404 may be utilized to form a chip package assembly 100 configured as a high band-width memory (HBM) device.

An exemplary chip package assembly 100 that may be formed utilizing the method 1400 described above is illustrated in FIG. 1. The chip package assembly 100 is considered a completed product that may be individually sold. The chip package assembly 100 may also be utilized as a component of a larger electronic device 180. As such, the method 1400 for fabricating the chip package assembly 100 may be extended to form an electronic device 180 at operation 1406.

At operation 1406, the chip package assembly 100 is mounted to a PCB 116 to form an electronic device 180. The chip package assembly 100 is mounted to the PCB 116 utilizing solder connections, such as solder balls 122 or other suitable connections. In the example depicted in FIG. 1, the bottom surface 132 of the package substrate 108 is electrically and mechanically coupled to the top surface 130 of the PCB by the solder balls 122. Described differently, the solder balls 122 are utilized to mechanically and electrically couple the electrical routing 222 of the second build-up region 206 forming part of the circuitry 160 of the package substrate 108 with the circuitry of the PCB 116.

Thus, an improved interconnect substrate having high density routings is described above which provides reduced cross talk and improved signal to noise ratio as compared to conventional substrate designs. The improved interconnect substrate utilizes a region of high density routings disposed over a region of low density routings. The region of high density routings includes thinner layers that do not require photoimageable dielectrics. Stacked vias comprising the electrical routing of the high density routing region are precisely aligned, and advantageously exhibit substantially reduced propensity for stress induced cracking as compared to stacked via of conventionally fabricated substrates that have poor alignment and different diameters. Furthermore, the precise alignment of vias enable solder connections between the substrate and integrated circuit (IC) dies to optionally be made without the use of contact pads thus reducing the cost and complexity of manufacture while enabling even greater routing density due to the reduced size requirement. Further routing density may be achieved in examples that eliminate the contact pads on the substrate allowing the vias of the substrate to solder directly to the dies. As a region of low density routings may be utilized in the substrate below the region of high density routings, further cost savings may be realized by leveraging the reduced density requirements on the printed circuit board side of the substrate to enable cost effective conventional manufacturing techniques in non-critical areas of the substrate. Advantageously, the high density substrate and chip package assembly having the same improves reliability and performance with routing densities not commercially viable utilizing conventional manufacturing techniques. For example, thin dielectric layers comprising the region of high density routings enables signal traces to be disposed within microns of ground traces, thus reducing capacitive coupling and reducing cross-talk, while desirably improving the speed and reliability of signal transmission. The improved interconnect substrate described herein may advantageously be utilized as a component for chip package assemblies and electronic devices, thus making those assemblies and devices more robust and reliable.

While the foregoing is directed to specific examples, other and further examples may be devised without departing from the basic scope thereof, and the scope thereof is determined by the claims that follow.

What is claimed is:

1. A method for fabricating an interconnect substrate for a chip package assembly, the method comprising:

forming a low density routing region; and forming a high density routing region on a top surface of the low density routing region, wherein forming the high density routing region comprises:

depositing a first seed layer on the top surface of the low density routing region;

patterning a first mask layer on the first seed layer;

forming a plurality of first conductive posts on the first seed layer;

removing the first mask layer and the first seed layer exposed between the plurality of first conductive posts;

depositing a first dielectric layer between the between the plurality of first conductive posts, wherein at least some of the plurality of first conductive posts are electrically coupled to conductive routing comprising the low density routing region;

depositing a second seed layer on the plurality of first conductive posts and the first dielectric layer; and forming a plurality of second conductive posts on the second seed layer.

2. The method of claim 1 further comprising:

thinning the first dielectric layer.

3. The method of claim 2, wherein thinning further comprises:

etching, polishing or grinding the first dielectric layer.

4. The method of claim 2, wherein thinning further comprises:

reducing a thickness of the first dielectric layer to less than about than about 5 μm.

5. The method of claim 2, wherein thinning the first dielectric layer further comprises:

reducing heights of plurality of first conductive posts.

6. The method of claim 1 further comprising:

patterning a second mask layer on the second seed layer;

removing the second mask layer and the second seed layer exposed between the plurality of second conductive posts; and depositing a second dielectric layer between the between the plurality of second conductive posts, wherein a first conductive post of the second conductive posts is coaxially formed on a second conductive post of the first conductive posts.

7. The method of claim 6 further comprising:

depositing a third seed layer on the plurality of second conductive posts and the second dielectric layer;

patterning a third mask layer on the third seed layer;

forming a plurality of third conductive posts on the third seed layer;

removing the third mask layer and the third seed layer exposed between the plurality of third conductive posts; and depositing a third dielectric layer between the between the plurality of third conductive posts, wherein a third conductive post of the third conductive posts is coaxially formed on the first conductive post of the plurality of first conductive posts.

8. The method of claim 7, wherein the first, second and third conductive posts have diameters that are within 1 μm of each other.

9. The method of claim 7 further comprising:

thinning the second dielectric layer prior to depositing the third dielectric layer.

10. The method of claim 1, wherein forming the low density routing region further comprises:

forming a first non-conductive layer of the low density routing region; and forming a via through the first non-conductive layer of the low density routing region, the via coupled to a first conductive post of the plurality of first conductive posts formed in the high density routing region.

11. The method of claim 10, wherein forming the via further comprises:

laser drilling the first non-conductive layer.

12. The method of claim 10 further comprising:

thinning the first dielectric layer to a thickness of less than a thickness of the first non-conductive layer, the thickness of the first dielectric layer being less than 5 μm.

13. The method of claim 1, wherein forming the first dielectric layer further comprises:

depositing a non-photoimageable material on the top surface of the low density routing region.

14. The method of claim 13, wherein depositing the non-photoimageable material further comprises:

depositing at least one of polyoxazole, polyimide, or epoxy on the top surface of the low density routing region.

15. A method for fabricating a chip package assembly, the method comprising:

attaching an IC die to a high density routing region formed on a top surface of a low density routing region, the high density routing region having a plurality of dielectric layers each having a thickness less than about 5 μm, the high and low density routing regions comprising part of an interconnect substrate, wherein forming the high density routing region comprises:

depositing a first seed layer on the top surface of the low density routing region;

patterning a first mask layer on the first seed layer;

forming a plurality of first conductive posts on the first seed layer;

removing the first mask layer and the first seed layer exposed between the plurality of first conductive posts;

depositing a first dielectric layer between the between the plurality of first conductive posts, wherein at least some of the plurality of first conductive posts are electrically coupled to conductive routing comprising the low density routing region;

depositing a second seed layer on the plurality of first conductive posts and the first dielectric layer; and forming a plurality of second conductive posts on the second seed layer; and reflowing solder interconnects disposed between the IC die and the interconnect substrate to mechanically and electrically couple circuitry of the IC die with circuitry of the interconnect substrate.

16. The method of claim 15 further comprising:

mounting a printed circuit board to the low density routing region utilizing solder interconnects to couple circuitry of a package substrate to circuitry of the interconnect substrate.

17. An interconnect substrate for a chip package assembly, comprising:

a low density routing region comprising:

a bottom layer having exposed contact pads;

a top surface; and interconnect routing coupling the contact pads exposed on the bottom layer;

a high density routing region disposed on the top surface of the low density routing region, the high density routing region comprising:

a plurality of dielectric layers having a thickness less than about 5 μm; and a plurality of coaxially aligned vias extending through the plurality of dielectric layers; and a first seed layer on the top surface of the low density routing region;

a plurality of first conductive posts on the first seed layer;

a first dielectric layer between the plurality of first conductive posts, wherein at least some of the plurality of first conductive posts are electrically coupled to conductive routing comprising the low density routing region;

a second seed layer deposited on the plurality of first conductive posts and the first dielectric layer; and a plurality of second conductive posts deposited on the second seed layer.

18. The interconnect substrate of claim 17, wherein the plurality of coaxially aligned vias include at least 3 vias having diameters within 1 μm in variation.

19. The interconnect substrate of claim 17, wherein the plurality of dielectric layers are fabricated from non-photo-imageable material.

20. A chip package assembly comprising:

the interconnect substrate of claim 17, and an integrated circuit die having exposed contact pads coupled by solder interconnects to the interconnect substrate, solder of the solder interconnects in direct contact with a surface of the vias exposed through the plurality of dielectric layers.

* * * * *

UNITED STATES PATENT AND TRADEMARK OFFICE

CERTIFICATE OF CORRECTION

PATENT NO. : 10,879,157 B2
APPLICATION NO. : 16/194213
DATED : December 29, 2020
INVENTOR(S) : Jaspreet Singh Gandhi It is certified that error appears in the above-identified patent and that said Letters Patent is hereby corrected as shown below:

In the Claims

Column 11, Line 12-13, In Claim 1, delete “between the between the” and insert -- between the --, therefor.

Column 11, Line 29-30, In Claim 4, delete “than about than about” and insert -- than about --, therefor.

Column 11, Line 39-40, In Claim 6, delete “between the between the” and insert -- between the --, therefor.

Column 11, Line 53, In Claim 7, delete “between the between the” and insert -- between the --, therefor.

Column 12, Line 38-39, In Claim 15, delete “between the between the” and insert -- between the --, therefor.

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*